(12) United States Patent
Ishiguro

(10) Patent No.: US 6,497,991 B1
(45) Date of Patent: Dec. 24, 2002

(54) METHOD OF PRODUCING A PRINTED CIRCUIT BOARD AND MASK FOR CARRYING OUT THE SAME

(75) Inventor: Takashi Ishiguro, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 40 days.

(21) Appl. No.: 09/606,691

(22) Filed: Jun. 30, 2000

(30) Foreign Application Priority Data

Jun. 30, 1999 (JP) ............................................ 11-184625

(51) Int. Cl.[7] .............................. G03F 7/00; B32B 3/00
(52) U.S. Cl. ........................ 430/311; 430/313; 430/316; 430/318; 430/322; 438/637; 438/638; 438/672
(58) Field of Search ................................. 430/311, 313, 430/316, 318, 322; 438/637, 638, 672

(56) References Cited

U.S. PATENT DOCUMENTS

| 5,660,321 A | | 8/1997 | Ishida et al. | |
|---|---|---|---|---|
| 5,888,627 A | * | 3/1999 | Nakatani | .................... 428/209 |
| 6,010,768 A | | 1/2000 | Yasue et al. | |
| 6,181,569 B1 | * | 1/2001 | Chakravorty | ................ 361/761 |
| 6,194,024 B1 | * | 2/2001 | Arldt et al. | .................... 427/97 |
| 6,219,253 B1 | * | 4/2001 | Green | ......................... 361/761 |
| 6,251,502 B1 | * | 6/2001 | Yasue et al. | ................. 428/209 |

FOREIGN PATENT DOCUMENTS

| JP | 55-138296 | 10/1980 |
|---|---|---|
| JP | 10-75027 | 3/1998 |

* cited by examiner

*Primary Examiner*—Janet Baxter
*Assistant Examiner*—Amanda C. Walke
(74) *Attorney, Agent, or Firm*—Sughrue Mion, PLLC

(57) ABSTRACT

Provided is a method of producing a printed circuit board. The method comprises preparing a base having a plurality of through via conductors having through holes, filling the through holes of the through via conductors with resin paste by printing in such a manner that, of the through holes, those which are arranged at smaller intervals are filled with a smaller amount of resin paste than those which are arranged at larger intervals, curing the resin paste, and removing an unnecessary portion of resin resulting from the curing of the resin paste. A mask used for carrying out the filling by printing is also provided.

14 Claims, 11 Drawing Sheets

METHOD OF PRODUCING A PRINTED CIRCUIT BOARD AND MASK FOR CARRYING OUT THE SAME

BACKGROUND OF THE INVENTION

The present invention relates in general to a method of producing a printed circuit board having through via conductors each having a through hole, and more specifically to a method of producing a printed circuit board wherein through holes of through via conductors are closed by resin fillings. The present invention further relates to a mask for carrying out the above described method.

Heretofore, for connection between wiring layers formed on the upper and lower surfaces of a printed circuit board, through via conductors have generally been used. In production of such a printed circuit board, the through holes of the through via conductors are closed by resin fillings so that an insulation resin layer formed over the through via holes can be flat or planar.

In this instance, the following method is known for closing the through holes of the through via conductors by resin fillings. In the first place, as shown in FIG. 10, a base 51 consisting of a substrate 50 and metal layers 52 covering the opposite upper and lower surfaces (though only the upper surface 51A is shown) of the substrate 50 is prepared. The base 51 has a plurality of through via conductors 55 extending completely between the upper surface 51A and lower surface of the base 51. Each through via conductor 55 has a through hole 54 defined by the inner circumferential surface thereof. A mask 61 having filling holes 62 aligned with the respective through holes 54 is placed on the surface 51A (printing surface). The through holes 54 are filled with resin paste by printing by the use of the mask 61.

After the filling by printing, the base 51 is heated to cure the resin paste fi lings 57 and thereby form cured resin fillings 58 in the through holes 54 as shown in FIG. 11.

Generally, the through holes 54 of the through via conductors 55 formed in the base 51 are not arranged at constant intervals but varying intervals. If the through holes 54 are filled with the same amount of resin paste 57, a larger amount of resin paste 57 per unit area is applied to a surface 51A region where the distance between adjacent two of the through holes 54 is smaller (the left-hand portion in FIG. 10) as compared with that applied to a surface 51A region where the distance between adjacent two of the through holes 54 is larger (the right-hand portion in FIG. 11).

In this instance, at the time of curing by heating, the resin paste 57 is once liquefied and spread over while wetting the surface 51A of the base 51, and thereafter cured. By observation of the surface 51A of the base 51 after the curing by heating, it will be found, as shown in FIG. 11, that the cured resin 58 in the surface 51A region where the distance between adjacent two of the through holes 54 is smaller protrudes from the surface 51A of the base 51 more than that in the surface 51A region where the distance between adjacent two of the through holes 54 is larger.

For this reason, when the unnecessary portion of the cured resin 58 is removed by grinding for thereby uncovering the surface of the metal layer 52, much time is required for removing the largely protuberant portion of the cured resin 58 (the left-hand portion in FIG. 11) or it may possibly occur such a case wherein the largely protuberant portion cannot be ground sufficiently, thus allowing some portion of the cured resin 58 to remain unremoved. Further, in case the surface 58A of the cured resin 58 has large undulations, a surface region (right-hand portion n FIG. 11) where only a small amount of resin 58 is present is ground excessively to cause even the metal layer 52 to be ground, thus causing the metal layer 52 to become thinner and, in the worst case, causing the substrate 50 to be exposed.

SUMMARY OF THE INVENTION

It is accordingly an object of the present invention to provide a method of producing a printed circuit board which enables, when through holes of through via conductors formed in a base is filled with resin paste and cured by heating, the surface of cured resin formed on the base to become nearly flat, thus making it possible to remove an unnecessary portion of the cured resin with ease and efficiency and therefore making it possible to obtain a high yield rate.

It is a further object of the present invention to provide a mask which is used in a method of producing a printed circuit board, of the foregoing character.

To accomplish the above objects, the present invention provides a method of producing a printed circuit board having a base provided with through via conductors having through holes closed by resin fillings. The method comprises preparing the base having the through via conductors having the through holes, filling the through holes of the through via conductors with resin paste in such a manner that, of the through holes, those which are arranged at smaller intervals are filled with a smaller amount of resin paste than those which are arranged at larger intervals, curing the resin paste, and removing an unnecessary portion of resin resulting from the curing of the resin paste and thereby forming the resin fillings.

The present invention further provides a mask for use in a method of producing a printed circuit board having a base provided with a plurality of through via conductors having through holes closed by resin fillings. The mask comprises a plurality of filling holes aligned with the through holes of the through via conductors, respectively, of the filling holes, those which are arranged at smaller intervals having a smaller cross sectional area than those which are arranged at larger intervals.

BRIEF DESCRIPTION OF THE DRAWINGS

FIGS. 10 and 11 are fragmentary sectional views of a base of a printed circuit board for illustrating steps of a prior art method of producing a printed circuit board, wherein FIG. 10 shows the base after a filling step and FIG. 11 shows the base after a curing step.

DESCRIPTION OF THE PREFERRED EMBODIMENT

Figure 1:
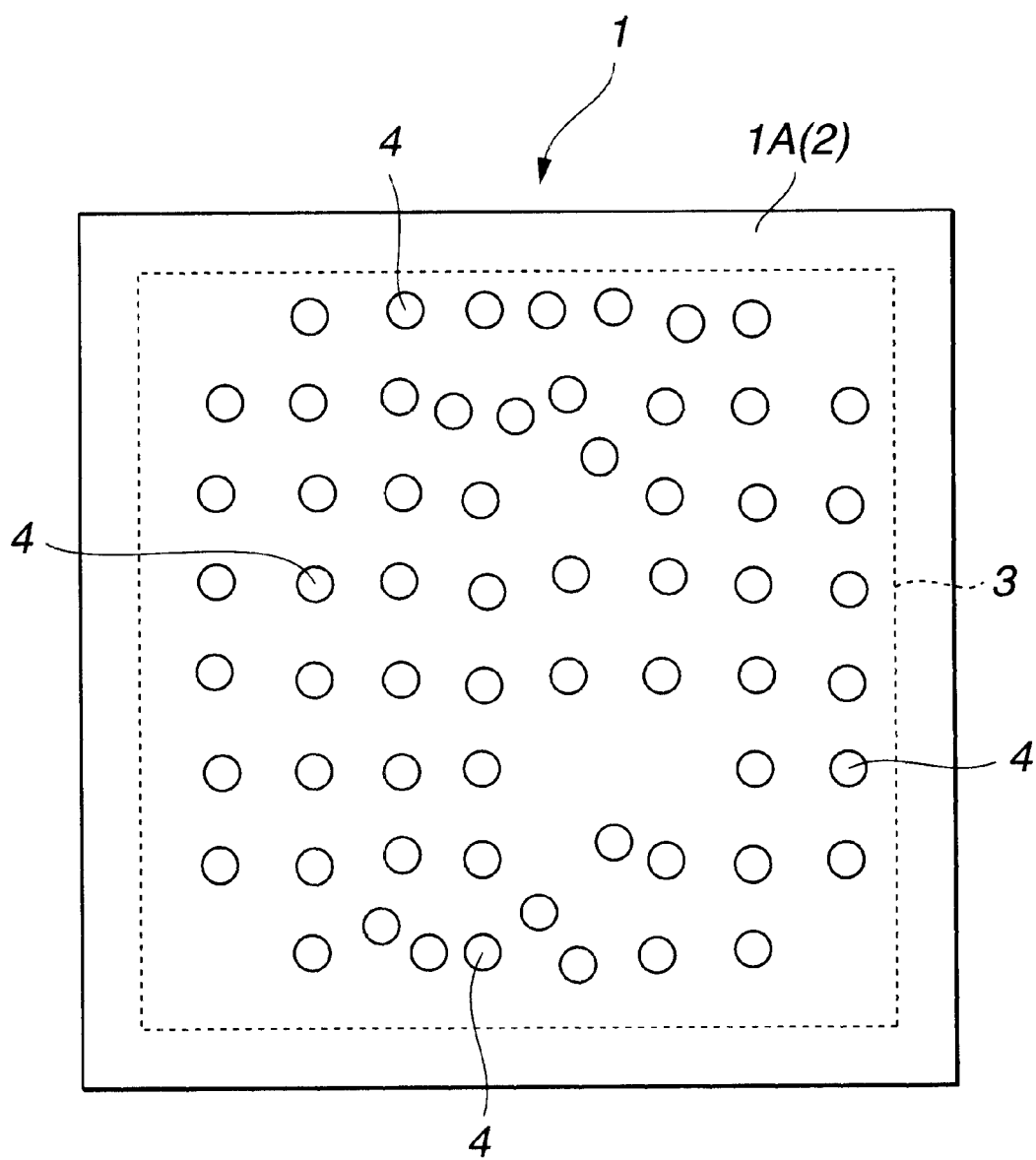
FIG. 1 is a plan view of a base of a printed circuit board before a filling step, which step constitutes part of a method of producing a printed circuit board according to an embodiment of the present invention.
Figure 2:
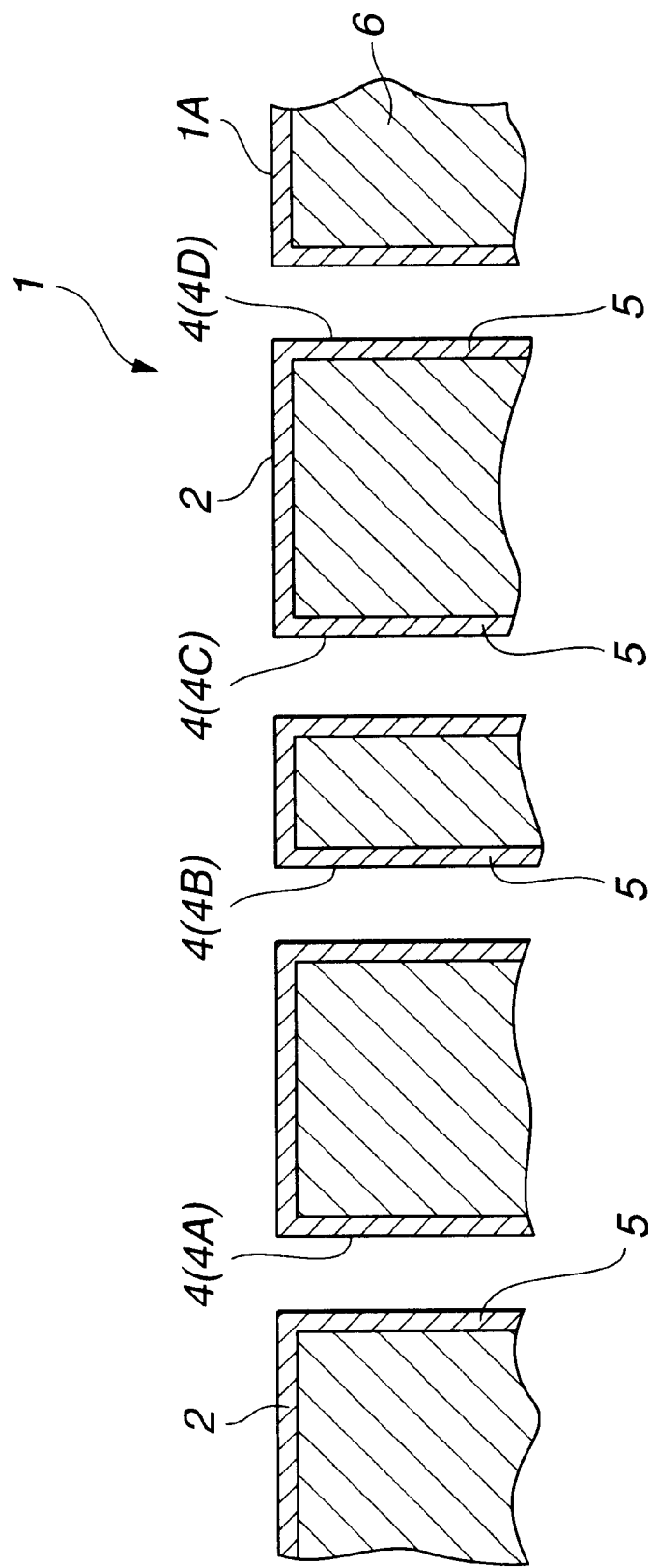
FIG. 2 is an enlarged, fragmentary sectional view of the base of FIG. 1.

Referring to FIGS. 1 to 9, inclusive, a method of producing a printed circuit board according to an embodiment of the present invention will be described.

In production of a printed circuit board, a base 1 is prepared beforehand. The base 1 is substantially rectangular when observed in a plan view and in the form of a plate of 800 $\mu$m thick. The base 1 consists of a substrate 6 of glass-BT resin and metal layers 2 formed on the upper and lower surface of the substrate 6, though only the metal layer 2 on the upper surface 1A is shown. The base 1 is. further formed with a number of through via conductors 5 extending completely between the upper surface 1A and lower surface thereof. Each through via conductor 5 has an inner circumferential surface defining a through hole 4 of 350 $\mu$m in diameter. The through holes 4 are not arranged at constant intervals but varying intervals, i.e., arranged in such a manner that the distance between adjacent two of the through holes 4 is large in a certain surface 1A region and small in another surface 1A region.

The base 1 is produced in the following manner. First, the substrate 6 having opposite upper and lower surfaces covered with copper films is drilled to make holes. Then, the drilled substrate 6 is electroless plated to form electroless plated layers of 0.7 $\mu$m thick on the upper and lower surfaces and the inner circumferential surfaces of the drilled holes. Further, the electroless plated substrate 6 are electroplated to form electroplated layers of 20 $\mu$m thick on the electroless plated layers. In this manner, the above described metal layers 2 each consisting of a copper film, electroless plated layer and electroplated layer and through via conductors 5 each consisting of an electroless plated layer and an electroplated layer are formed. Thereafter, the substrate 6 is treated with a surface roughening process and a rust-prevention process and is thereby formed into the base 1.

Figure 3:
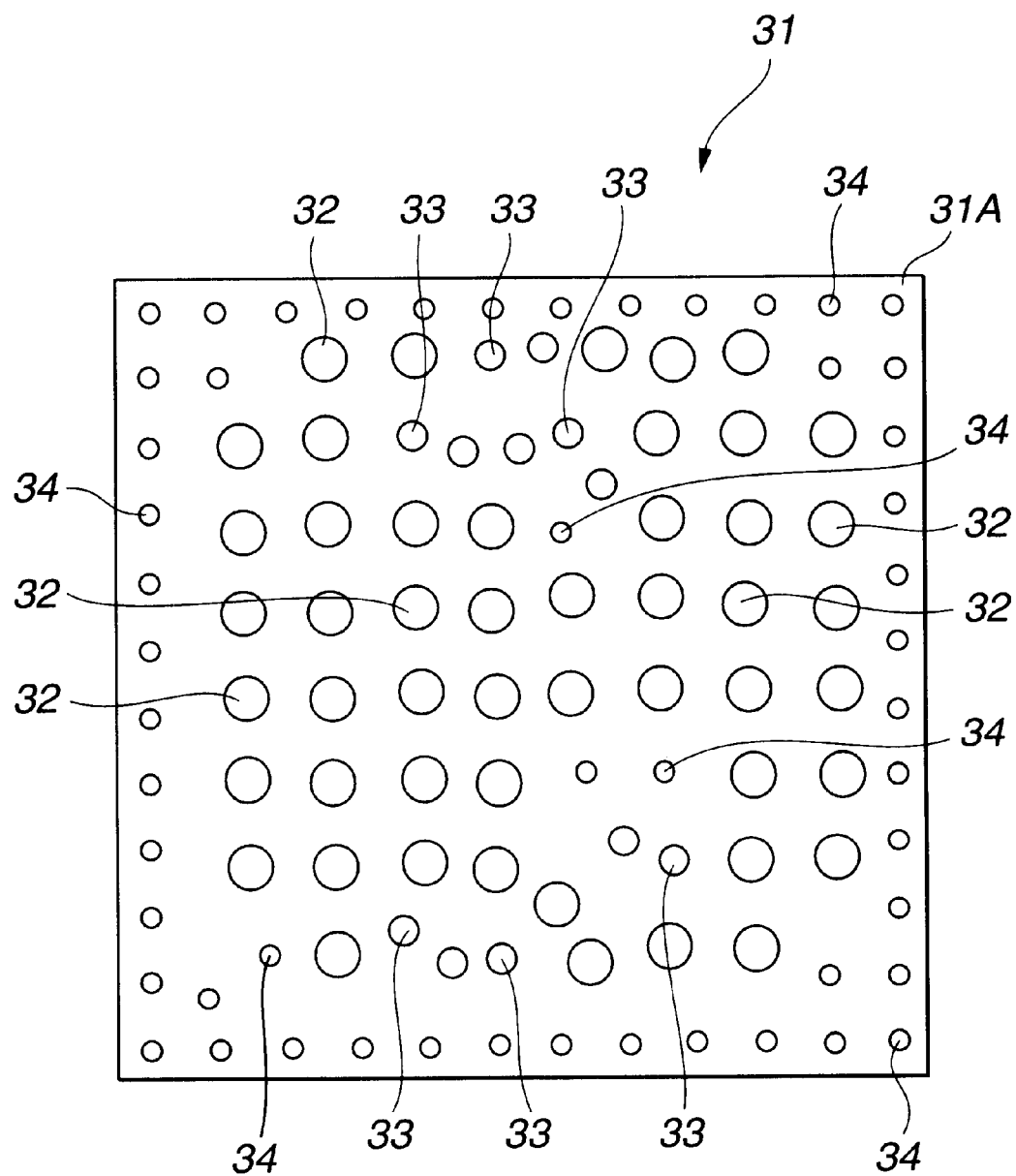
FIG. 3 is a plan view of a mask used for carrying out a filling step according to the embodiment of the present invention.

Further, in production of a printed circuit board, a metal mask 31 is prepared beforehand according to an embodiment of the present invention. FIG. 3 is a plan view of the metal mask 31 when observed from a surface 31A side thereof.

The metal mask 31 is in the form of a nearly square plate of 150 $\mu$m thick and provided with a plurality of three kinds of filling holes, i.e., first filling holes 32, second filling holes 33 and third filling holes 34. All of the filling holes are nearly circular in cross section and nearly uniform in diameter, and sized such that the first filling holes 32 are 525 $\mu$m in diameter, the second filling holes 33 are 450 $\mu$m in diameter and the third filling holes 34 are 300 $\mu$m in diameter. Namely, the second filling holes 33 have a smaller cross sectional area than the first filling holes 32, and the third filling hole have a smaller cross sectional area than the second filling holes 33.

While all of the first filling holes 32 and second filling holes 33 are aligned with the through holes 4 of the through via conductors 5 of the base 1, the first filling holes 32 are aligned with the through holes 4 arranged at intervals larger than a predetermined value and the second filling holes 33 are aligned with the through holes 4 arranged at intervals smaller than a predetermined value. In other words, the first filling hole 32 are aligned with the through holes 4 which are arranged so that the distance between adjacent two of the through holes 4 is smaller than a predetermined value, and the second filling holes 33 are aligned with the through holes 4 which are arranged so that the distance between adjacent two of the through holes 4 is smaller than a predetermined value. Specifically, in this embodiment, the second filling holes 33 are aligned with the through holes 4 which are arranged so that the distance between adjacent two of the through holes 4 is equal to or smaller than 800 $\mu$m. The first filling holes 32 are aligned with the through holes 4 which are arranged so that the distance between adjacent two of the through holes 4 is larger than 800 $\mu$m.

The third filling holes 34 are aligned with neither of the through holes 4 of the through via conductors 5. The third filling holes 34 are provided for forming wartlike resin paste projections 8 on the surface 1A of the base 1. The wartlike resin paste projections 8 are provided in a marginal region of the surface 1A surrounding a region 3 of the surface 1A in which the through holes 4 are disposed and which is indicated by the dotted line in FIG. 1. The wartlike resin paste projections 8 are further provided at portions or points of the surface 1A which are more than a predetermined amount distant from adjacent one of the through holes 4 and the wartlike resin paste projections 8, i.e., the third filling holes 34 are provided at portions or points of the surface 1A which are more than a predetermined amount distant from adjacent one of the first, second and third filling holes 32, 33 and 34. Specifically, the metal mask 31 of this embodiment are provided with the third filling holes 34 at portions or pints of the surface 1A which are more than 750 $\mu$m distant from adjacent one of the through holes 4 and the wartlike resin paste projections 8.

A method of making a printed circuit board will now be described.

Figure 4:
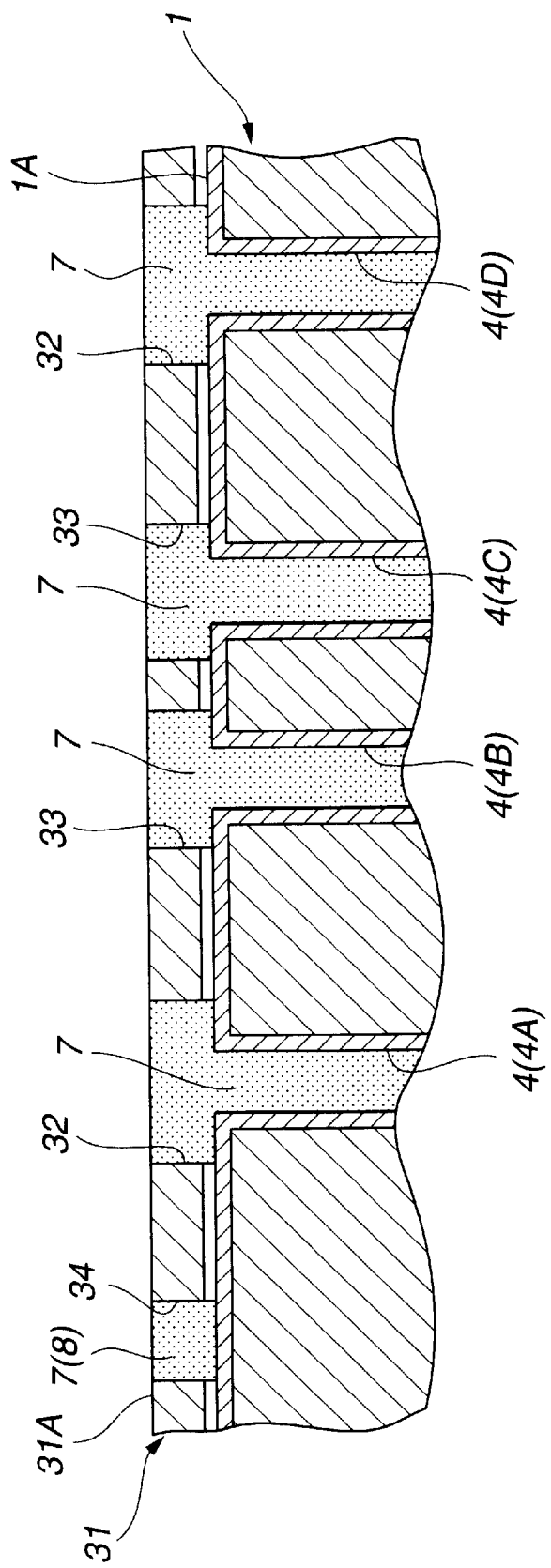
FIG. 4 is an enlarged, fragmentary sectional view of the base of FIG. 1 after the filling step according to the embodiment of the present invention.
Figure 5:
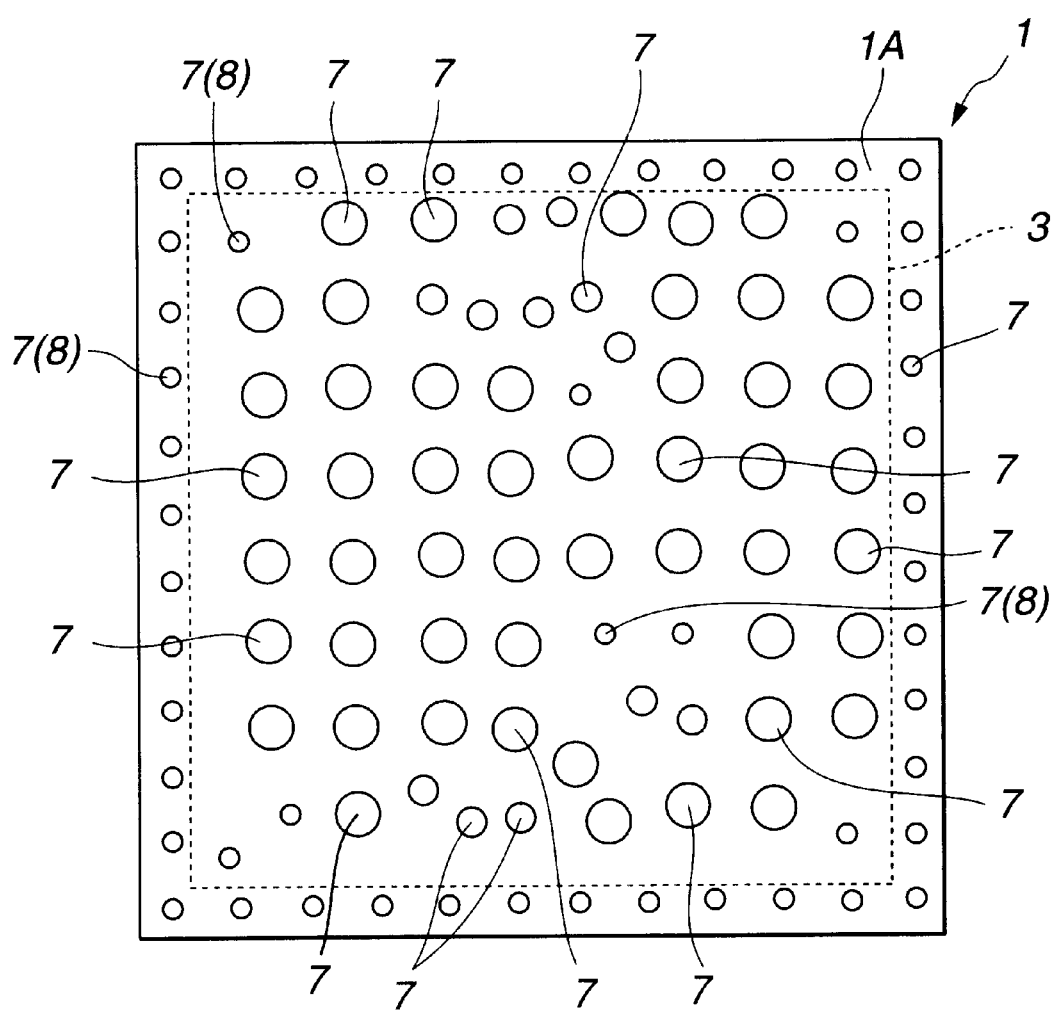
FIG. 5 is a plan view of the base of FIG. 1 after the filling step according to the embodiment of the present invention.
Figure 6:
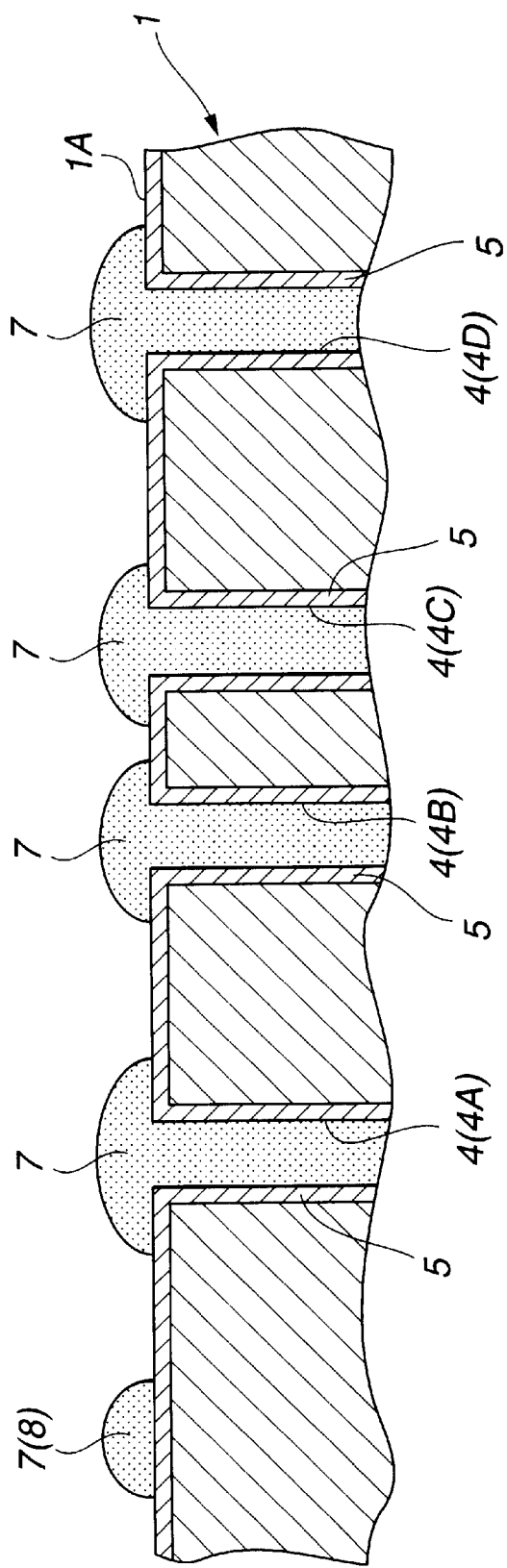
FIG. 6 is an enlarged, fragmentary sectional view of the base of FIG. 1 after the filling step according to the embodiment of the present invention.

In a filling step, the base 1 is mounted on a jig (not shown). Then, as shown in FIG. 4, the mask 31 is disposed in place on the surface 1A (printed surface) of the base 1. Resin paste 7 is applied into the through holes 4 by printing while the air in the through holes 4 is drawn from the lower surface side of the base 1.

In this instance, the through holes 4 arranged at intervals equal to or smaller than 800 $\mu$m (i.e., the second through hole 4B and third through hole 4C from the left in FIG. 4) are aligned with the second filling holes 33, and the through holes 4 arranged at intervals larger than 800 $\mu$m (i.e., the first through hole 4A and the fourth through hole 4D from the left in FIG. 4) are aligned with the first filling holes 32. For this reason, a smaller amount of resin paste 7 is applied to the through holes 4 such as 4B and 4C in FIG. 4, arranged at intervals equal to or smaller than 800 $\mu$m, as compared with that applied to the through holes 4 such as 4A and 4D, which are arranged at intervals larger than 800 $\mu$m.

Further, simultaneously with the above described filling, resin paste 7 is applied through the third filling holes 34 onto the surface 1A of the base 1 by printing for forming the wartlike resin paste projections 8 (as shown at the left in FIG. 4).

Thereafter, the metal mask 31 is removed from the base 1. By this, the base 1 is put into such a condition shown in FIGS. 5 and 6, i.e., in a condition in which the resin paste 7 fills up the through holes 4 (4A–4D) while partly protruding from the upper surface 1A of the base 1. Further, on the surface 1A of the base 1, a plurality of wartlike, nearly semi-spherical projections 8 are formed from resin paste 7 and by the third filling holes 34 of the metal mask 31 by printing.

Since a smaller amount of resin paste is applied to the through holes 4 such as 4B and 4C, which are arranged at intervals equal to or smaller than 800 μm, as compared with the through holes 4 such as 4A and 4D, which are arranged at intervals larger than 800 μm, a correspondingly smaller amount of resin paste 7 protrudes from the through holes 4 such as 4B and 4C to lie over the surface 1A of the base 1.

Further, a number of wartlike resin paste projections 8 of 300 μm in diameter are formed in the marginal region of the surface 1A surrounding the region 3. Further, the wartlike resin paste projections 8 are formed at portions or points of the surface 1A which are more than 750 μm distant from adjacent one of the through holes 4 and the wartlike resin paste projections 8.

In the meantime, the resin paste projections 8 which are too large, particularly, larger than 500 μm in diameter are not desirable since removal of the metal mask 31 cannot be attained with ease. Further, the wartlike resin paste projections 8 which are smaller than 100 μm in diameter are also not desirable since they cannot produce a sufficient effect of restricting the spreading of the resin paste 7 of each through hole 4 over the surface 1A of the base 1 in a curing step which will be described hereinlater, within narrow limits. For this reason, it is desirable to fix the diameter of the resin paste projections 8 at a value ranging from 100 μm to 300 μm. Further, the third filling holes 34 of a circular cross section are desirable since they enable easy removal of the metal mask 31.

Then, in the curing step, the base 1 having applied thereto the resin paste 7 by printing is heated at 120° C. for 20 minutes to cure the resin paste 7 filling the through holes 4 and the wartlike resin paste projections 8.

The resin paste 7 filling the through holes 4 and the wartlike resin paste projections 8 are once melted and spread over the surface 1A of the base 1 while wetting the same. However, in this embodiment, a smaller amount of resin paste 7 is applied to the through holes 4 such as 4B and 4C, which are arranged at intervals equal to or smaller than 800 μm, and the wartlike resin paste projections 8 are applied by printing to the surface 1A region surrounding the region 3 and to the surface 1A points which are more than 750 μm distant from adjacent one of the through holes 4 and the wartlike resin paste projections 8. For this reason, it never occurs that the surface 1A of the base 1 is partially covered by a too much or too small amount of the molten resin paste 7. Namely, when the resin paste 7 is melted and spread over the surface 1A of the base 1, the surface of the resin paste 7 on the surface 1A of the base 1 is nearly flat.

Figure 7:
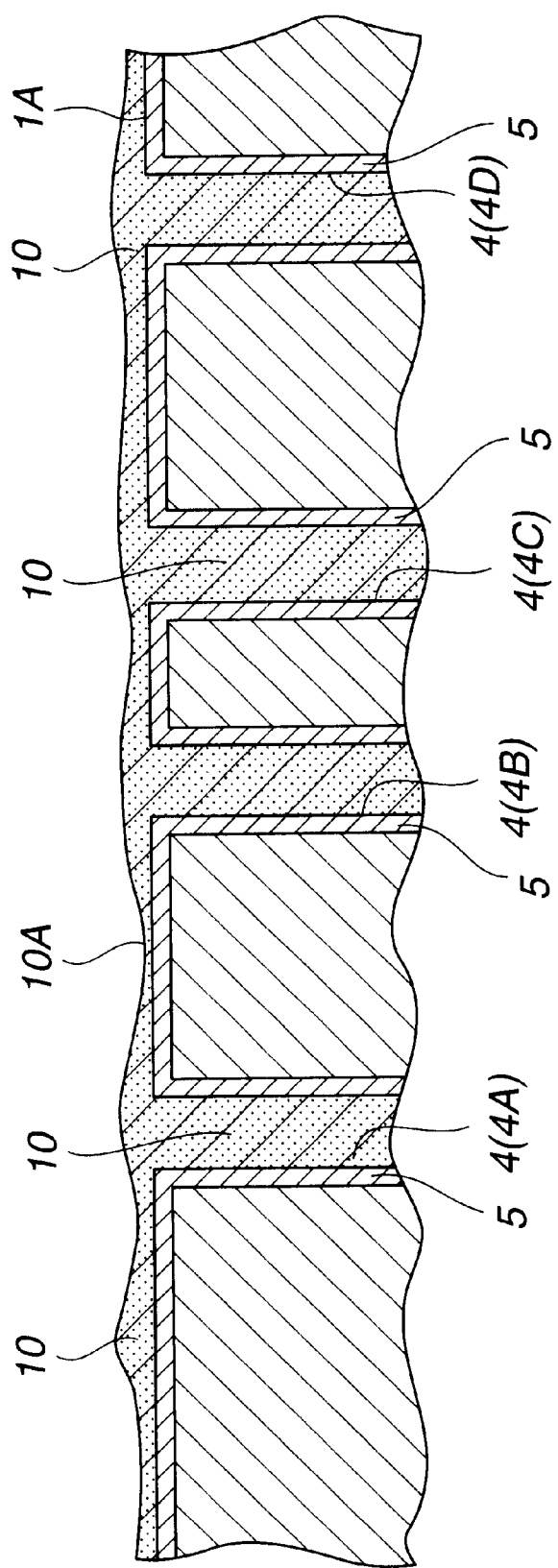
FIG. 7 is an enlarged, fragmentary sectional view of the base of FIG. 1 after a curing step according to the embodiment of the present invention.

Accordingly, after that, when the molten resin paste 7 is cured, the surface 10A of the cured resin 10 lying on the surface 1A of the base 1 does not have large irregularities but only small irregularities as shown in FIG. 7.

Figure 8:
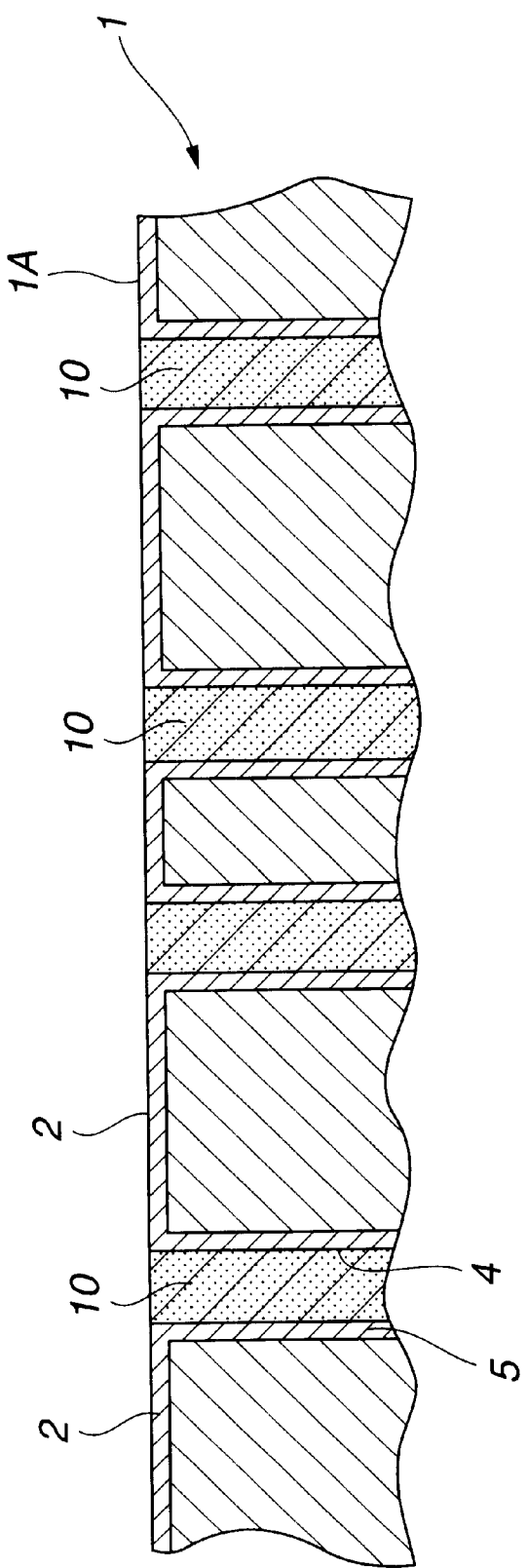
FIG. 8 is a view similar to FIG. 7 but shows the base after a grinding step according to the embodiment of the present invention.

Then, in a grinding step, as shown in FIG. 8, an unnecessary part of the resin 10 lying on the surface 1A of the base 1 is removed by grinding by using a belt sander and is further removed by buffing to make the surface of the cured resin filling 10 within each through hole 4 be flush with the surface 1A of the base 1 so that all the surface of the metal layer 2 is exposed. In the meantime, the cured resin on the lower surface of the base 1 is similarly removed by grinding and buffing. After the removal by grinding and buffing, the base 1 is cleaned by ultrasonic cleaning.

In the foregoing, in the base 1 formed with the cured resin 10 as shown in FIG. 7, the cured resin 10 lying on the surface 1A of the base 1 has a nearly uniform thickness as a whole and therefore the surface 10A can be nearly flat. Thus, an unnecessary part of the cured resin 10 lying on the surface 1A of the base 1 can be removed by grinding within a short time. Further, there never occurs such a case in which the cured resin 10 is removed partially insufficiently by grinding and therefore an unnecessary portion of the cured resin 10 remains unremoved or the cured resin 10 is removed partially excessively by grinding and therefore the metal layer 2 becomes partially thinner or is partially removed completely to allow even the substrate 6 to be exposed.

Figure 9:
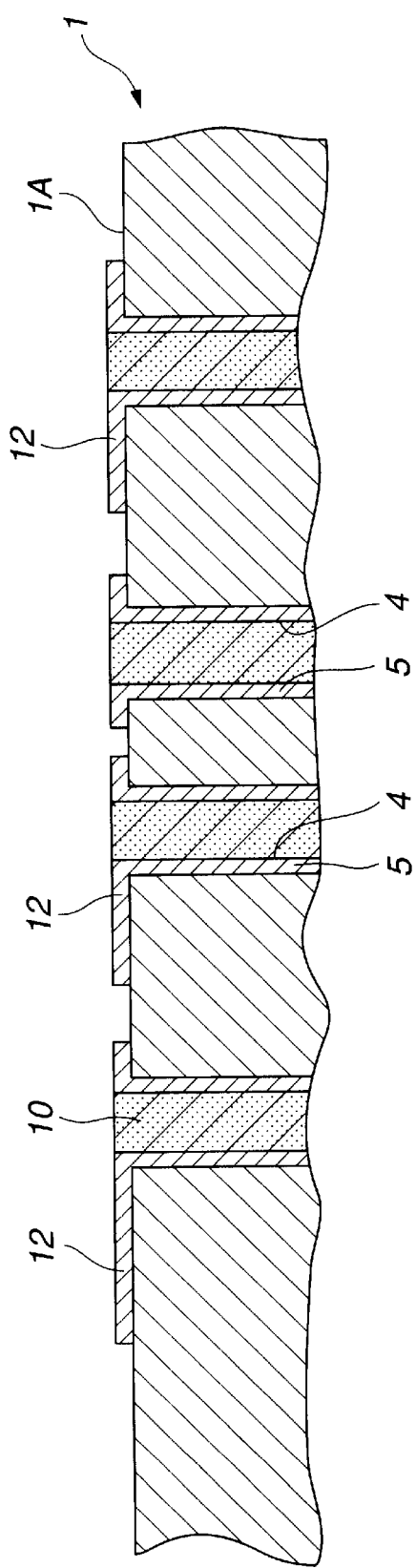
FIG. 9 is an enlarged, fragmentary sectional view of a printed circuit board with a wiring layer, which is produced by the method according to the embodiment of the present invention.
Figure 10:
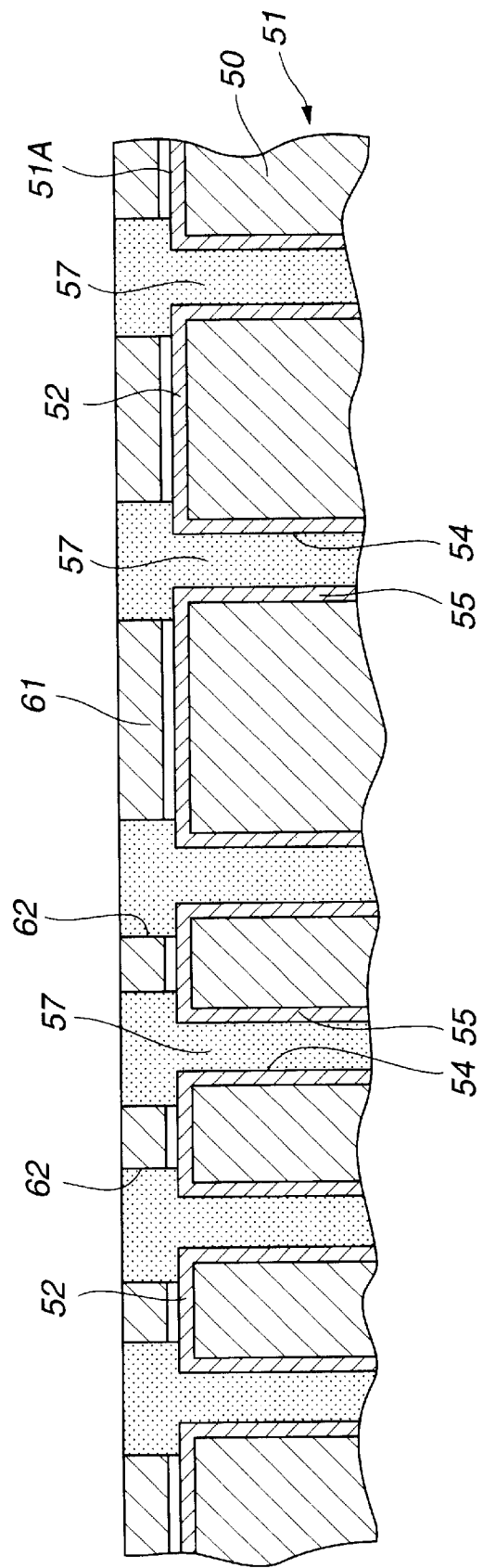
Figure 11:
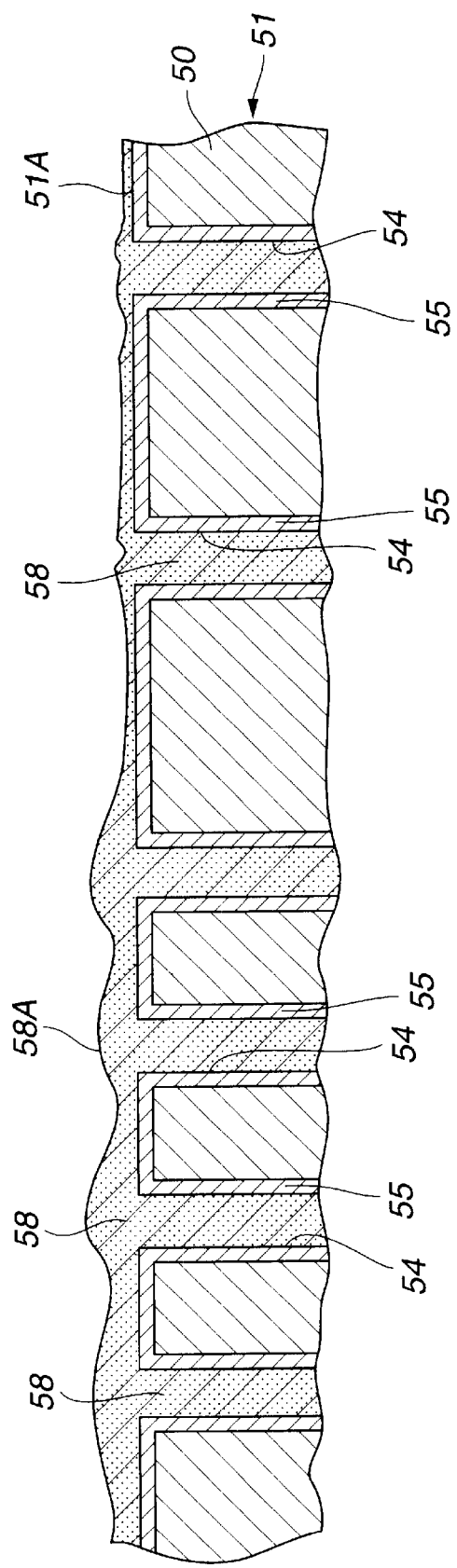

Then, a dry film for etching is disposed on the entire upper and lower surfaces of the base 1 to cover the same and is subjected to exposure and development to be formed into a predetermined pattern. The exposed part of the metal layer 2 is removed by etching for thereby forming the metal layer 2 into a wiring layer, and then the dry film is removed. Thereafter, the base 1 is heated to cure the resin 10 within the through holes 4 completely. The surface of the wiring layer is treated by a surface roughening process and a rust-preventing process. In this manner, as shown in FIG. 9, the wiring layer 12 is formed on the surface 1A of the base 1.

Thereafter, by the known techniques, an insulation resin layer, a wiring layer and so on are formed on the surface 1A of the base 1 to complete a printed circuit board.

As having been explained as above, in the method of producing a printed circuit board according to an embodiment of the present invention, filling up of the through holes 4 of the through via conductors 5 with the resin paste 7 is performed in such a manner that, of the through holes 4, those which are arranged at intervals equal to or smaller than 800 μm are filled with a smaller amount of resin paste than those which are arranged at intervals larger than 800 μm. Specifically, application of the resin paste 7 is performed by printing by using the metal mask 31 having the first filling holes 32 aligned with the through holes 4 arranged at intervals larger than 800 μm and the second through holes 33 aligned with the through holes 4 arranged at intervals equal to or smaller than 800 μm, the cross sectional area of the second filling hole 33 being smaller than that of the first filling hole 32.

For this reason, when the base 1 is filled with the resin paste 7 and subjected to heating to cure the resin paste 7, the surface 10A (printed surface) of the resin 10 above the surface 1A of the base 1 will assuredly become nearly flat. Accordingly, removal of an unnecessary portion of the resin 10 carried out thereafter can be attained with ease, thus making it possible to obtain a high yielding rate in production of the printed circuit board.

Further, in this embodiment, the wartlike resin paste projections 8 are applied by printing to the marginal region of the surface 1A surrounding the region 3 and to the portions or points of the surface 1A which are more than 750 μm distant from adjacent one of the through holes 4 and the wartlike resin paste projections 8.

By this, at the time of heating and curing of the resin paste 7 and the wartlike resin paste projections 8, it becomes possible to prevent such reduction in the amount of resin paste 7 remaining within each through hole 4 due to a so-called bleed-out phenomenon that causes the upper surfaces of the resin paste fillings 7 to recede or sink and become lower in level than the upper surface 1A of the base 1, whereby the resin 10 lying on the surface 1A of the base 1 can have a uniform thickness and a nearly flat surface 10A.

While the present invention has been described and shown as above, it is not for the purpose limitation but modifications and variations of the embodiment described above will occur to those skilled in the art, in light of the above teachings.

For example, while the metal mask 31 is used for application of the resin paste 7 by printing and it is preferably to carry out application of the resin paste 7 onto the surface 1A of the base 1 by printing by the use of the metal mask 31, the application of the resin paste 7 can be attained without using the metal mask 31, for example, the resin paste 7 can be applied directly into the through holes 4 by means of a cylinder. Also in this instance, the through holes 4 arranged at relatively smaller intervals are filled with a smaller amount of resin paste 7 than the through holes 4 arranged at relatively larger intervals.

Further, while all the filling holes of the metal mask 31 are nearly circular in cross section, they can be modified to have another cross section such as a fan-shaped cross section, an oval-shape cross section, a rectangular cross section and a square cross section. When it is hard to fill the through hole 4 with a predetermined amount of resin paste 7 due to air confined within the through hole 4 of the through via conductor 5, such a case can sometimes be solved by changing the cross sectional shape of the filling hole of the mask 31.

Further, while in the above described embodiment the base 1 is shown as being made up of the substrate 6 having the metal layers 2 on the entire opposite side surfaces thereof, this is not for the purpose of limitation but the metal layers 2 can be replaced by wiring layers of predetermined patterns. Further, the substrate 6 made up of a single insulation layer can be replaced by another one so that a base can be of such a kind consisting of a plurality of insulation layers and wiring layers laminated one upon another.

Further, in this embodiment, the base 1 having the metal layer 2 constituting the entire surface 1A is used and the wiring layer 12 is formed from the metal layer 2 after the through holes 4 of the through via conductors 5 are filled with the resin 10. However, from the metal layer 2 of the base 1, the wiring layer 12 can be formed previously in the manner described above and thereafter application of the resin paste 7 by printing can be performed for closing the through holes 4 by the resin 10.

In this instance, in the grinding process, the unnecessary resin is removed by grinding to expose the wiring layer 12 and make the surface of the wiring layer 12, the surfaces of the fillings of resin 10 within the through holes 4 and the surfaces of layers of resin 10 located between separate sections of the wiring layer 12 be flush with each other.

While in the above described embodiment the filling amount of resin paste 7 is reduced in case the distance between adjacent two of the through holes 4 is equal to or smaller than 800 $\mu$m, the reference value of the distance or interval can be changed on consideration of the fluidity of the resin paste employed, the property of the surface of the base with respect to spreading and wetting of the resin layer, the thickness of the metal mask, the size of the through holes of the through via conductors, etc. Further, at the time of formation of the wartlike resin paste projections 8, a reference value for the distance from adjacent one of the through holes 4 can be changed similarly.

Further, while in the above described embodiment a reference value for the distance between adjacent two of the through holes 4 is set at 800 $\mu$m for making a two-stage change of the filling amount of resin paste 7, a plurality of stepwise varying reference values can be set to change the filling amount of resin paste 7 multi-stepwise. Further, the filling amount of resin paste 7 can be changed in proportion to a variation of the distance between adjacent two of the through holes 4.

In the meantime, such a two-stage variation of the filling amount of resin paste 7 in response to a variation of the interval between adjacent two of the through holes 4, is not required to be made against the entire base 1 but against part of same according to the necessity.

The scope of the invention is defined in the following claims.

What is claimed is:

1. A method of producing a printed circuit board having a base provided with through via conductors having through holes closed by resin fillings, the method comprising:

preparing said base having said through via conductors having said through holes wherein said through holes comprise at least a first group arranged at larger intervals and a second group arranged at smaller intervals, less than said larger intervals;

filling said through holes of said through via conductors with resin paste in such a manner that, of said through holes, those in said second group which are arranged at smaller intervals are filled with a smaller amount of resin paste than those in said first group which are arranged at larger intervals;

curing said resin paste; and removing an unnecessary portion of resin resulting from said curing of said resin paste and thereby forming said resin fillings.

2. The method according to claim 1, wherein said filling comprises printing by the use of a mask having a plurality of filling holes aligned with said through holes, respectively, of said filling holes, those which are aligned with said through holes arranged at said smaller intervals, having a smaller cross sectional area than those which are aligned with said through holes arranged at said larger intervals.

3. The method according to claim 2, wherein said filling further comprises printing a plurality of resin paste projections in a region surrounding a region of a surface of said base in which said through holes are disposed and at points of said surface which are more than a predetermined amount distant from adjacent ones of said through holes and said resin paste projections.

4. The method according to claim 3, wherein said resin paste projections are nearly semi-spherical and of the diameter ranging from 100 to 300 $\mu$m.

5. A method of producing a printed circuit board having a base provided with through via conductors having through holes closed by resin fillings, the method comprising:

preparing said base having said through via conductors having said through holes;

filling said through holes of said through via conductors with resin paste in such a manner that, of said through holes, those which are arranged at smaller intervals are filled with a smaller amount of resin paste than those which are arranged at larger intervals;

curing said resin paste; and removing an unnecessary portion of resin resulting from said curing of said resin paste and thereby forming said resin fillings, wherein the distance between adjacent two of said through holes arranged at said smaller intervals is equal to or smaller than 800 $\mu$m, and the distance between adjacent two of said through holes arranged at said larger intervals is larger than 800 μm.

6. A method of producing a printed circuit board having a base provided with through via conductors having through holes closed by resin fillings, the method comprising:

preparing said base having said through via conductors having said through holes;

filling said through holes of said through via conductors with resin paste in such a manner that, of said through holes, those which are arranged at smaller intervals are filled with a smaller amount of resin paste than those which are arranged at larger intervals;

curing said resin paste; and removing an unnecessary portion of resin resulting from said curing of said resin paste and thereby forming said resin fillings wherein said filing comprises printing by the use of a mask having a plurality of filling holes aligned with said through holes, respectively, of said filling holes, those which are aligned with said through holes arranged at said smaller intervals, having a smaller cross sectional area than those which are aligned with said through holes arranged at said larger intervals;

wherein said filing further comprises printing a plurality of resin paste projections in a region surrounding a region of a surface of said base in which said through holes are disposed and at points of said surface which are more than a predetermined amount distant from adjacent one of said through holes and said resin paste projections; and wherein said predetermined amount is 750 μm.

7. A method of producing a printed circuit board having a base provided with a plurality of through via conductors having through holes closed by resin fillings, the method comprising:

preparing said base having said through via conductors having said through holes, wherein said through holes comprise at least a first group arranged at larger intervals and a second group arranged at smaller intervals less than said larger intervals;

filling said through holes of said through via conductors with resin paste in such a manner as to provide, of said through holes, those in said second group which are arranged at intervals equal to or smaller than a predetermined value with a smaller excess of resin paste than those in said first group which are arranged at intervals larger than said predetermined value;

curing said resin paste while allowing said excess of resin paste to be spread over a surface of said base; and removing an unnecessary portion of resin resulting from said excess of said resin paste and thereby forming said resin fillings.

8. The method according to claim 7, wherein said filling comprises printing by the use of a mask having a plurality of filling holes aligned with said through holes, respectively, of said filling holes, those which are aligned with said through holes arranged at intervals smaller than said predetermined value, having a smaller cross sectional are than those which are aligned with said through holes arranged at intervals larger than said predetermined value.

9. The method according to claim 7, wherein said filling further comprises printing a plurality of resin paste projections in a region surrounding a region of said surface of said base in which said through holes are disposed and at points of said surface which are more than a predetermined amount distant from adjacent one of said through holes and said resin paste projections.

10. The method according to claim 9, wherein said resin paste projections are nearly semi-spherical and of the diameter ranging from 100 to 300 μm.

11. The method according to claim 9, wherein said printing of said resin paste projections is performed by the use of said metal mask which are further provided with filling holes aligned with said resin paste projections to be formed.

12. The method according to claim 7, wherein said base has a metal layer constituting said surface.

13. A method of producing a printed circuit board having a base provided with a plurality of through via conductors having through holes closed by resin fillings, the method comprising:

preparing said base having said through via conductors having said through holes;

filling said through holes of said through via conductors with resin paste in such a manner as to provide, of said through holes, those which are arranged at intervals equal to or smaller than a predetermined value with a smaller excess of resin paste than those which are arranged at intervals larger than said predetermined value;

curing said resin paste while allowing said excess of resin paste to be spread over a surface of said base; and removing an unnecessary portion of resin resulting from said excess of said resin paste and thereby forming said resin fillings, wherein said predetermined value is 800 μm.

14. A method of producing a printed circuit board having a base provided with a plurality of through via conductors having through holes closed by resin fillings, the method comprising:

preparing said base having said through via conductors having said through holes;

filling said through holes of said through via conductors with resin paste in such a manner as to provide, of said through holes, those which are arranged at intervals equal to or smaller than a predetermined value with a smaller excess of resin paste than those which are arranged at intervals larger than said predetermined value;

curing said resin paste while allowing said excess of resin paste to be spread over a surface of said base; and removing an unnecessary portion of resin resulting from said excess of said resin paste and thereby forming said resin fillings;

wherein said filling further comprises printing a plurality of resin paste projections in a region surrounding a region of said surface of said base in which said through holes are disposed and at points of said surface which are more than a predetermined amount distant from adjacent one of said through holes and said resin paste projections, and wherein said predetermined amount is 750 μm.

* * * * *